United States Patent
Kato et al.

(10) Patent No.: US 6,853,009 B2
(45) Date of Patent: Feb. 8, 2005

(54) LIGHT-EMITTING SEMICONDUCTOR DEVICE USING GALLIUM NITRIDE COMPOUND SEMICONDUCTOR

(75) Inventors: Hisaki Kato, Aichi-ken (JP); Hiroshi Watanabe, Aichi-ken (JP); Norikatsu Koide, Naka-ken (JP); Shinya Asami, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/166,371

(22) Filed: Jun. 11, 2002

(65) Prior Publication Data

US 2002/0149024 A1 Oct. 17, 2002

Related U.S. Application Data

(62) Division of application No. 09/394,527, filed on Sep. 10, 1999, now Pat. No. 6,423,984.

(30) Foreign Application Priority Data

Sep. 10, 1998 (JP) ........................... 10-276453
Sep. 10, 1998 (JP) ........................... 10-276454
Sep. 10, 1998 (JP) ........................... 10-276455

(51) Int. Cl.$^7$ ........................... H01L 29/06; H01L 29/76
(52) U.S. Cl. ........................... 257/94; 287/36; 287/103; 287/14
(58) Field of Search ........................... 257/103, 96, 94, 257/14

(56) References Cited

U.S. PATENT DOCUMENTS

| | | | |
|---|---|---|---|
| 5,726,465 A | | 3/1998 | Gerner et al. |
| 5,786,606 A | | 7/1998 | Nishio et al. |
| 5,917,201 A | | 6/1999 | Ming-Jiunn et al. |
| 5,945,689 A | | 8/1999 | Koike et al. |
| 6,078,064 A | | 6/2000 | Ming-Jiunn et al. |
| 6,111,266 A | * | 8/2000 | Carline et al. |
| 6,281,526 B1 | | 8/2001 | Nitta et al. |
| 6,288,416 B1 | | 9/2001 | Koike et al. |
| 6,307,219 B1 | | 10/2001 | Oku et al. |
| 6,345,063 B1 | | 2/2002 | Bour et al. |
| 6,346,720 B1 | | 2/2002 | Iyechika et al. |
| 6,420,733 B2 | * | 7/2002 | Koide et al. |
| 6,504,171 B1 | * | 1/2003 | Grillot et al. |
| 6,555,403 B1 | * | 4/2003 | Domen et al. |

FOREIGN PATENT DOCUMENTS

| | | |
|---|---|---|
| JP | 08-083956 | 3/1996 |
| JP | 8-116128 | 5/1996 |
| JP | 8-179387 | 7/1996 |

(List continued on next page.)

OTHER PUBLICATIONS

Apr. 24, 2003 Office Action of Japanese Patent Application No. 10–276453 (with partial English translation).

(List continued on next page.)

Primary Examiner—Amir Zarabian
Assistant Examiner—Kiesha Rose
(74) Attorney, Agent, or Firm—McGinn & Gibb, PLLC

(57) ABSTRACT

A barrier layer made of $Al_xGa_{1-x}N$ ($0<x\leq0.18$) is formed in a light-emitting semiconductor device using gallium nitride compound having a multi quantum-well (MQW) structure. By controlling a composition ratio x of aluminum (Al) or thickness of the barrier layer, luminous intensity of the device is improved.

An n-cladding layer made of $Al_xGa_{1-x}N$ ($0<x\leq0.06$) is formed in a light-emitting semiconductor device using gallium nitride compound. By controlling a composition ratio x of aluminum or thickness of the n-cladding layer, luminous intensity of the device is improved.

A p-type layer and an n-type layer are formed in a light-emitting semiconductor device using gallium nitride compound having a double-hetero junction structure. By controlling a ratio of a hole concentration of the p-type layer and an electron concentration of the n-type layer approximates to 1, luminous intensity of the device is improved.

4 Claims, 9 Drawing Sheets

FOREIGN PATENT DOCUMENTS

| | | |
|---|---|---|
| JP | 08-264831 | 10/1996 |
| JP | 8-316528 | 11/1996 |
| JP | 08-316587 | 11/1996 |
| JP | 9-36422 | 2/1997 |
| JP | 9-36423 | 2/1997 |
| JP | 9-36430 | 2/1997 |
| JP | 09-074249 | 3/1997 |
| JP | 09-092880 | 4/1997 |
| JP | 09-186364 | 7/1997 |
| JP | 09-312417 | 12/1997 |
| JP | 10-004210 | 1/1998 |
| JP | 10-012922 | 1/1998 |
| JP | 10-032189 | 2/1998 |
| JP | 10-90738 | 4/1998 |
| JP | 10-135514 | 5/1998 |
| JP | 10-145004 | 5/1998 |
| JP | 10-150219 | 6/1998 |
| WO | PCT/GB/01913 | 4/1993 |

OTHER PUBLICATIONS

Apr. 4, 2003 Office Action of Japanese Patent Application No. 10–276454 (with partial English translation).

Japanese Office Action forwarded on Sep. 24, 2003, in Japnaese Patent Application No. Hei. 10–276455 with partial English translation.

Japanese Patent Application Laid–opan No. Hei. 10–32189 with concise statement of relevance.

Japanese Office Action forwarded Sep. 24, 2003 in Japanese Patent Application No. Hei. 10–276453 with partial English translation.

Japanese Patent Application Laid–open No. Hei. 9–312417 with concise statement of relevance.

Japanese Patent Application Laid–open No. Hei. 9–186364 with concise statement of relevance.

Japanese Office Action forwarded Sep. 24, 2003 in Japanese Patent Application No. Hei. 10–276454 with partial English translation.

Partial translation of Japanese Patent Application No. 8–316587.

Partial translation of Japanese Patent Application No. 8–83956.

* cited by examiner

Electron Concentration of n-contact layer (cm$^{-3}$)

LIGHT-EMITTING SEMICONDUCTOR DEVICE USING GALLIUM NITRIDE COMPOUND SEMICONDUCTOR

This is a Divisional application of U.S. application Ser. No. 09/394,527, which was filed on Sep. 10, 1999, now U.S. Pat. No. 6,423,984 and whose contents are incorporated in their entirety by reference.

BACKGROUND OF THE INVENTION

1. Field of the Invention

The present invention relates to a light-emitting device using gallium nitride compound semiconductor whose luminous efficiency is improved. Especially, the present invention relates to the device which emits the ultraviolet ray.

2. Description of the Related Art

A conventional light-emitting device, which have layers made of gallium nitride compound semiconductor laminated on a substrate, is known to have the following structure. The device has a sapphire substrate, and on the sapphire substrate the following layers are formed sequentially: a buffer layer made of aluminum nitride (AlN); an n-cladding and/or an n-contact layer of high carrier concentration, which is made of a silicon (Si) doped GaN of n-type conduction; an emission layer having a multi quantum-well (MQW) structure, in which a barrier layer made of GaN and a well layer made of InGaN are laminated alternately; a p-cladding layer made of magnesium (Mg) doped AlGaN of p-type conduction; and a p-contact layer made of magnesium (Mg) doped GaN of p-type conduction.

And a conventional light-emitting device using gallium nitride compound semiconductor which emits the ultraviolet ray is known to have an emission layer made of InGaN or AlGaN. The device having an emission layer made of InGaN can obtain an ultraviolet ray having a wavelength of lower than 380 nm, which is emitted from band to band, when a composition ratio of indium (In) is less than 5.5%. The device having an emission layer made of AlGaN can obtain an ultraviolet ray having a wavelength of 380 nm, which is emitted by a pair of donor and acceptor, when a composition ratio of aluminum (Al) is about 16% and the emission layer is doped with zinc (Zn) and silicon (Si).

However, a problem persists in luminous efficiency. In the conventional light-emitting devices using gallium nitride compound semiconductor, conditions for emitting light are not always optimized. Therefore, further improvement has been required, as presently appreciated by the present inventors.

SUMMARY OF THE INVENTION

An object of the present invention is to improve luminous efficiency of a light-emitting device using gallium nitride compound semiconductor.

To achieve the above object, a first aspect of the present invention is to obtain a light-emitting device using gallium nitride semiconductor comprising an emission layer with a multi quantum-well (MQW) structure, in which a barrier layer and a well layer are formed alternately. The barrier layer is made of $Al_xGa_{1-x}N$ ($0<x\leq0.18$).

The second aspect of the present invention is to form the well layer made of $In_yGa_{1-y}N$ ($0<y\leq0.1$).

The third aspect of the present invention is to form the barrier layer to have a thickness from 2 nm to 10 nm.

The fourth aspect of the present invention is to form the barrier layer to have a thickness from 3 nm to 8 nm.

The fifth aspect of the present invention is to design a luminous wavelength in the ultraviolet ray region.

The sixth aspect of the present invention is to obtain a light-emitting device using gallium nitride compound semiconductor comprising an emission layer with a multi quantum-well (MQW) structure, in which a barrier layer and a well layer are formed alternately, and an n-layer made of an impurity-doped $Al_xGa_{1-x}N$ ($0<x\leq0.06$).

The seventh aspect of the present invention is to form a strain relaxation layer made of $In_yGa_{1-y}N$ ($0.02<y\leq0.04$) which is formed under the n-layer.

The eighth aspect of the present invention is to form the n-layer to have a thickness from 50 nm to 300 nm.

The ninth aspect of the present invention is to form the n-layer to have a thickness from 150 nm to 250 nm.

The tenth aspect of the present invention is to design a luminous wavelength to be in the ultraviolet ray range.

The eleventh aspect of the present invention is to obtain a light-emitting device using gallium nitride compound semiconductor comprising an emission layer with a multi quantum-well (MQW) structure, in which a barrier layer and a well layer are formed alternately, a p-layer, and an n-layer. The emission layer is sandwiched by the p-layer and the n-layer, and a ratio of an electron concentration of the n-layer to a hole concentration of the p-layer (electron/hole) is from 0.5 to 2.0.

The twelfth aspect of the present invention is to obtain a light-emitting device using gallium nitride compound semiconductor comprising an emission layer with a multi quantum-well (MQW) structure, in which a barrier layer and a well layer are formed alternately, a p-layer, and an n-layer. The emission layer is sandwiched by the p-layer and the n-layer, and a ratio of an electron concentration of the n-layer to a hole concentration of the p-layer (electron/hole) is from 0.7 to 1.43.

The thirteenth aspect of the present invention is to obtain a light-emitting device using gallium nitride compound semiconductor comprising an emission layer with a multi quantum-well (MQW) structure, in which a barrier layer and a well layer are formed alternately, a p-layer, and an n-layer. The emission layer is sandwiched by the p-layer and the n-layer, and a ratio of an electron concentration of the n-layer to a hole concentration of the p-layer (electron/hole) is from 0.8 to 1.25.

The fourteenth aspect of the present invention is to design a luminous wavelength in the ultraviolet ray range.

With respect to a gallium nitride compound semiconductor which satisfies the formula $Al_xGa_{1-x-y}In_yN$, the larger a composition ratio x of aluminum (Al), is, the larger a band gap energy becomes, and the larger a composition ratio y of indium (In) is, the smaller the band gap energy becomes. With respect to a light-emission device using gallium nitride compound semiconductor which has an emission layer with a multi quantum-well (MQW) structure, an energy barrier between a well layer and a barrier layer becomes larger when the barrier layer is made of $Al_xGa_{1-x}N$. A luminous intensity of the device is strongly related to a composition ratio x of aluminum (Al) in $Al_xGa_{1-x}N$ barrier layer. Various samples of a barrier layer made of $Al_xGa_{1-x}N$, each having a different composition ratio x of aluminum (Al), are formed and the electroluminescence (EL) luminous intensity is measured. FIG. 2 illustrates a graph of the electroluminescence (EL) luminous intensity. As shown in FIG. 2, the luminous intensity of the light-emitting device becomes larger in accordance with the composition ratio of aluminum (Al). The composition ratio x should be preferably in the range of $0.06 < x \leq 0.18$. When x, or a composition ratio of aluminum (Al), is smaller than 0.06, an effect for mixing aluminum (Al) in the barrier layer is small. When x is larger than 0.18, a lattice matching of the barrier layer becomes worse and as a result luminous intensity is lowered.

Samples of a light-emitting device having a well layer made of $In_yGa_{1-y}N$ which has a smaller band gap are formed. When y, or a composition ratio of indium (In), is smaller than 0.1, a crystallization of the well layer becomes worse, and the device cannot have a large luminous intensity.

Various samples of a barrier layer each having a different thickness are formed. FIG. 3 illustrates the electroluminescence (EL) luminous intensity of the light-emitting device having the barrier layer made of $Al_xGa_{1-x}N$. As shown in FIG. 3, the thickness of the barrier layer should be preferably in the range of 2 nm to 10 nm, more preferably 3 nm to 8 nm.

When an n-cladding layer which contacts to the emission layer is made of $Al_xGa_{1-x}N$ ($0 < x \leq 0.06$), holes in the emission layer is prevented from leaking to the lower n-layer side through the n-cladding layer. Also, a lattice mismatching of the emission layer which is grown on the n-cladding layer can be relaxed and as a result a crystallization of the emission layer is improved. Accordingly, a luminous efficiency of the light-emitting device can be improved.

A luminous intensity of the light-emitting device is strongly related to a composition ratio x of aluminum (Al) in $Al_xGa_{1-x}N$ n-cladding layer. Various samples of an n-cladding layer made of $Al_xGa_{1-x}N$, each having a different composition ratio x of aluminum (Al), are formed and the electroluminescence (EL) luminous intensity is measured. FIG. 5 illustrates a graph of the electroluminescence (EL) luminous intensity. As shown in FIG. 5, the luminous intensity of the light-emitting device becomes larger in accordance with the composition ratio of aluminum (Al). And when the composition ratio x is around 0.05, luminous intensity of the device shows its peak. The composition ratio x should be preferably in the range of $0.03 < x \leq 0.06$. When x, or a composition ratio of aluminum (Al), is smaller than 0.03, the device becomes just like a device without an n-cladding layer and holes leak to the lower n-layer side through the n-cladding layer. When x is larger than 0.06, a crystallization of the emission layer is lowered because of too much aluminum (Al) existing in the n-cladding layer, and as a result the luminous intensity of the device is lowered.

Various samples of an n-cladding layer each having a different thickness are formed. FIG. 6 illustrates the electroluminescence (EL) luminous intensity of the light-emitting device having the n-cladding layer made of $Al_xGa_{1-x}N$. As shown in FIG. 6, the luminous intensity of the device shows its peak when the thickness of the n-cladding layer is around 200 nm. The thickness of the n-cladding layer should be preferably in the range of 50 nm to 300 nm, more preferably 150 nm to 250 nm.

With respect to a light-emitting device using gallium nitride compound semiconductor which has a double-hetero junction structure, forming an n-type layer is easier than forming a p-type layer. A hole concentration of the p-type layer is smaller than an electron concentration of the n-type layer. FIGS. 8 and 9 illustrate graphs of the electroluminescence (EL) luminous intensity of the light-emitting device when each electron concentrations of an n-cladding layer and an n-contact layer is varied in order that a ratio of the electron concentration of each n-type layers, the n-cladding layer and the n-contact layer to a hole concentration of each p-type layers, a p-cladding layer and a p-contact layer, respectively, approximates to 1. Here a hole concentration of the p-cladding layer and the p-contact layer is $2 \times 10^{17}/cm^3$ and $7 \times 10^{17}/cm^3$, respectively.

A luminous intensity of the light-emitting device is strongly related to an electron concentration of $Al_{0.05}Ga_{0.95}N$ n-cladding layer. Various samples of an n-cladding layer made of $Al_{0.05}Ga_{0.95}N$, each having a different electron concentration, are formed and the electroluminescence (EL) luminous intensity is measured. FIG. 8 illustrates a graph of the electroluminescence (EL) luminous intensity. As shown in FIG. 8, the luminous intensity of the light-emitting device shows its peak when the electron concentration of the n-cladding layer is around $8 \times 10^{17}/cm^3$.

Also, the luminous intensity of the light-emitting device is strongly related to an electron concentration of GaN n-contact layer. Various samples of an n-contact layer made of GaN, each having a different electron concentration, are formed and the electroluminescence (EL) luminous intensity is measured. FIG. 9 illustrates a graph of the electroluminescence (EL) luminous intensity. As shown in FIG. 9, the luminous intensity of the light-emitting device becomes larger in accordance that the electron concentration of GaN n-cladding layer becomes $1.1 \times 10^{18}/cm^3$, $8 \times 10^{17}/cm^3$, and $4 \times 10^{17}/cm^3$. This proves that a recombination of electrons and holes occurs at the inside of the emission layer. In short, when an electron concentration of the n-cladding layer or the n-contact layer is larger than a hole concentration of the p-cladding layer or the p-contact layer, electrons tend to recombine with holes at the p-contact or the p-cladding layer side from the emission layer. And if a recombination of electrons and holes which does not emit lights increases under this condition, it is considered that balancing a hole concentration of the p-cladding or the p-contacting layer and an electron concentration of the n-cladding or the n-contact layer is effective for decreasing the non-emissive recombination of electrons and holes.

Here the n-cladding layer made of GaN needs to have an electron concentration of at least $1 \times 10^{17}/cm^3$ in order to form an electrode, inject electrons and drive the light-emitting device.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

The present invention will be described hereinbelow with reference to specific embodiments.

(First Embodiment)

Figure 1:
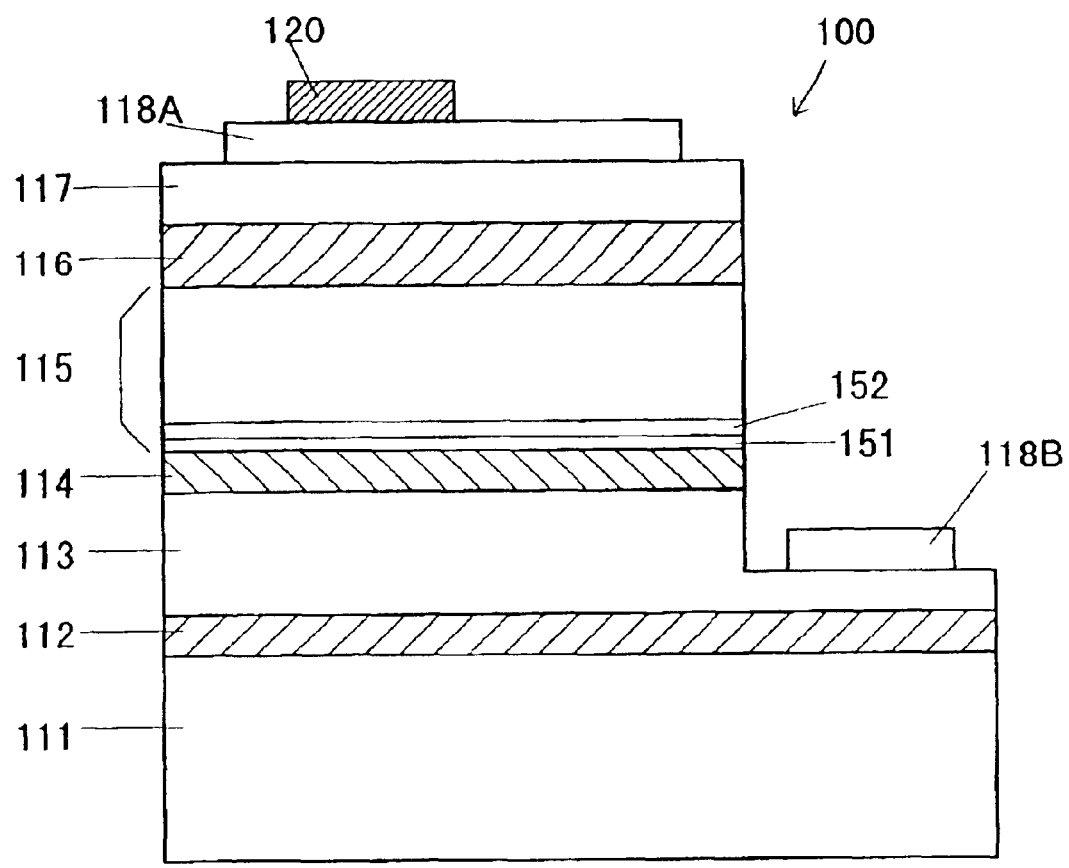
FIG. 1 is a sectional view of a light-emitting device 100 using gallium nitride compound in accordance with the first embodiment of the present invention.

FIG. 1 illustrates a sectional view of a light-emitting device 100 using gallium nitride (GaN) compound semiconductor formed on a sapphire substrate 111. The light-emitting device 100 has a sapphire substrate 111 which has a buffer layer 112 made of nitride aluminum (AlN) having a thickness of 25 nm and an n-cladding or an n-contact layer ($n^+$-layer) 113 made of silicon (Si) doped GaN and having a thickness of 3000 nm successively thereon.

And a strain relaxation layer 114 made of a non-doped $In_{0.03}Ga_{0.97}N$ having a thickness of about 180 nm is formed on the n-cladding layer or the n-contact layer ($n^+$-layer) 113. The strain relaxation layer 114 functions to relax a stress to an emission layer 115, generated by the difference between thermal expansion coefficients of the sapphire substrate 111 and the emission layer 115.

An emission layer 115 is constructed with a multi quantum-well (MQW) structure, which is made of six barrier layers 151 made of $Al_{0.13}Ga_{0.87}N$ having a thickness of about 3.5 nm and five well layers 152 made of $In_{0.05}Ga_{0.95}N$ having a thickness of about 3 nm laminated alternately, is formed on the strain relaxation layer 114. A p-cladding layer 116 made of a p-type $Al_{0.15}Ga_{0.85}N$ having a thickness of about 25 nm is formed on the emission layer 115. Further, a p-contact layer 117 made of a p-type GaN having a thickness about 100 nm is formed on the p-cladding layer 116.

An electrode 118A which transmits lights is formed by a metal deposit on the p-contact layer 117 and an electrode 118B is formed on the $n^+$-layer 113. The electrode 118A which transmits lights is constructed with about 1.5 nm in thickness of cobalt (Co), which contacts to the p-contact layer 117, and about 6 nm in thickness of gold (Au), which contacts to the cobalt (Co). The electrode 118B is constructed with about 20 nm in thickness of vanadium (V) and about 1800 nm in thickness of aluminum (Al) or an alloy including aluminum (Al). And an electrode pad 120 having a thickness about 1500 nm is formed on the electrode 118A. The electrode pad 120 is made of cobalt (Co), nickel (Ni) or vanadium (V), and gold (Au) or aluminum (Al), or an alloy including at least one of these metals.

Then a method for manufacturing the light-emitting device 100 is explained hereinafter.

Each of the layers of the light-emitting device 100 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 111 was placed on a susceptor in a reaction chamber for the MOVPE treatment after its main surface 'a' was cleaned by an organic washing solvent and heat treatment. Then the sapphire substrate 111 was baked at 1100° C. by $H_2$ vapor fed into the chamber under normal pressure.

About 25 nm in thickness of AlN buffer layer 112 was formed on the surface 'a' of the baked sapphire substrate 111 under conditions controlled by lowering the temperature in the chamber to 400° C., keeping the temperature constant, and concurrently supplying $H_2$, $NH_3$ and TMA.

About 3 μm in thickness of GaN was formed on the buffer layer 112, as an n-cladding or n-contact layer ($n^+$-layer) 113 with an electron concentration of $2\times10^{18}/cm^3$, under conditions controlled by keeping the temperature of the sapphire substrate 111 at 1150° C. and concurrently supplying $H_2$, $NH_3$, TMG and silane.

About 180 nm in thickness of non-doped $In_{0.03}Ga_{0.97}N$ was formed on the $n^+$-layer 113, as a strain relaxation layer 114, under conditions controlled by lowering the temperature of the sapphire substrate 111 to 850° C., keeping the temperature constant and concurrently supplying $N_2$ or $H_2$, $NH_3$, TMG and TMI.

Then a barrier layer 151 made of $Al_{0.13}Ga_{0.87}N$ was formed under conditions controlled by raising the temperature of the sapphire substrate 111 to 1150° C. again, keeping the temperature constant and concurrently supplying $N_2$ or $H_2$, $NH_3$, TMG and TMA. And about 3 nm in thickness of $In_{0.05}Ga_{0.95}N$ was formed on the barrier layer 151, as a well layer 152, concurrently supplying $N_2$ or $H_2$, $NH_3$, TMG and TMI. Similarly, four pairs of the barrier layer 151 and the well layer 152 were formed in sequence under the same respective conditions, and then a barrier layer 151 made of $Al_xGa_{1-x}N$ was formed on the fifth pair of the barrier layer 151 and the well layer 152. Accordingly, an emission layer 115 having a multi-quantum well (MQW) structure was formed.

About 25 nm in thickness of Mg-doped p-type $Al_{0.15}Ga_{0.85}N$ was formed on the emission layer 115, as a p-cladding layer 116, under conditions controlled by keeping the temperature of the sapphire substrate 111 at 1150° C. and concurrently supplying $N_2$ or $H_2$, $NH_3$, TMG, TMA and $CP_2Mg$.

About 100 nm in thickness of Mg-doped p-type GaN was formed on the p-cladding layer 116, as a p-contact layer 117, under conditions controlled by keeping the temperature of the sapphire substrate 111 at 1100° C. and concurrently supplying $N_2$ or $H_2$, $NH_3$, TMG, and $CP_2Mg$.

An etching mask is formed on the p-contact layer 117, and a predetermined region of the mask is removed. Then, exposed portions of the p-contact layer 117, the p-cladding layer 116, the emission layer 115, the strain relaxation layer 114, and some part of the $n^+$-layer 113 were etched by a reactive ion etching using gas including chlorine (Cl). Accordingly, the surface of the $n^+$-layer 113 was exposed.

Then, an electrode 118B and an electrode 118A which transmits lights were formed on the $n^+$-layer 113 and the p-contact layer 117, respectively, as follows.

(1) A photoresist layer was laminated on the n+-layer 113. A window was formed on a fixed region of the exposed surface of the n+-layer 113 by patterning using photolithography. After exhausting in high vacuum lower than $10^{-4}$ Pa vacuum order, about 20 nm in thickness of vanadium (V) and about 1800 nm in thickness of aluminum (Al) were deposited on the window. Then, the photoresist layer laminated on the n+-layer 113 was removed. Accordingly, the electrode 118B was formed on the exposed surface of the n+-layer 113.

(2) A photoresist layer was laminated on the p-contact layer 117. The photoresist layer of an electrode forming part on the p-contact layer 117 was removed by patterning using photolithography, and a window was formed there.

(3) After exhausting in high vacuum lower than $10^{-6}$ Torr vacuum order, about 1.5 nm in thickness of cobalt (Co) and about 6 nm in thickness of gold (Au) were formed in sequence on the photoresist layer and the exposed surface of the p-contact layer 117 in a reaction chamber for deposit.

(4) The sample was took out from the reaction chamber for deposit. Then cobalt (Co) and gold (Au) laminated on the photoresist layer were removed by a lift-off, and an electrode 118A which transmits lights is formed on the p-contact layer 117.

(5) To form an electrode pad 120 for a bonding, a window was formed on a photoresist layer, which was laminated uniformly on the electrode 118A. About 1.5 $\mu$m in thickness of cobalt (Co), nickel (Ni) or vanadium (V) and gold (Au), aluminum (Al) or an alloy including at least one of those metals were deposited on the photoresist layer. Then, as in the process (4), cobalt (Co), nickel (Ni) or vanadium (V) and gold (Au), aluminum (Al) or an alloy including at least one of those metals laminated on the photoresist layer were removed by a lift-off, and an electrode pad 120 was formed.

(6) After the atmosphere of the sample was exhausted by a vacuum pump, $O_2$ gas was supplied until the pressure becomes 3 Pa. Under conditions controlled by keeping the pressure constant and keeping the temperature of the atmosphere about 550° C., the sample was heated for about 3 min. Accordingly, the p-contact layer 117 and the p-cladding layer 116 were changed to have lower resistive p-type, and the p-contact layer 117 and the electrode 118A, and the n+-layer 113 and the electrode 118B, respectively, are alloyed.

Through the process of (1) to (6), the light-emitting device 100 was formed.

Figure 2:
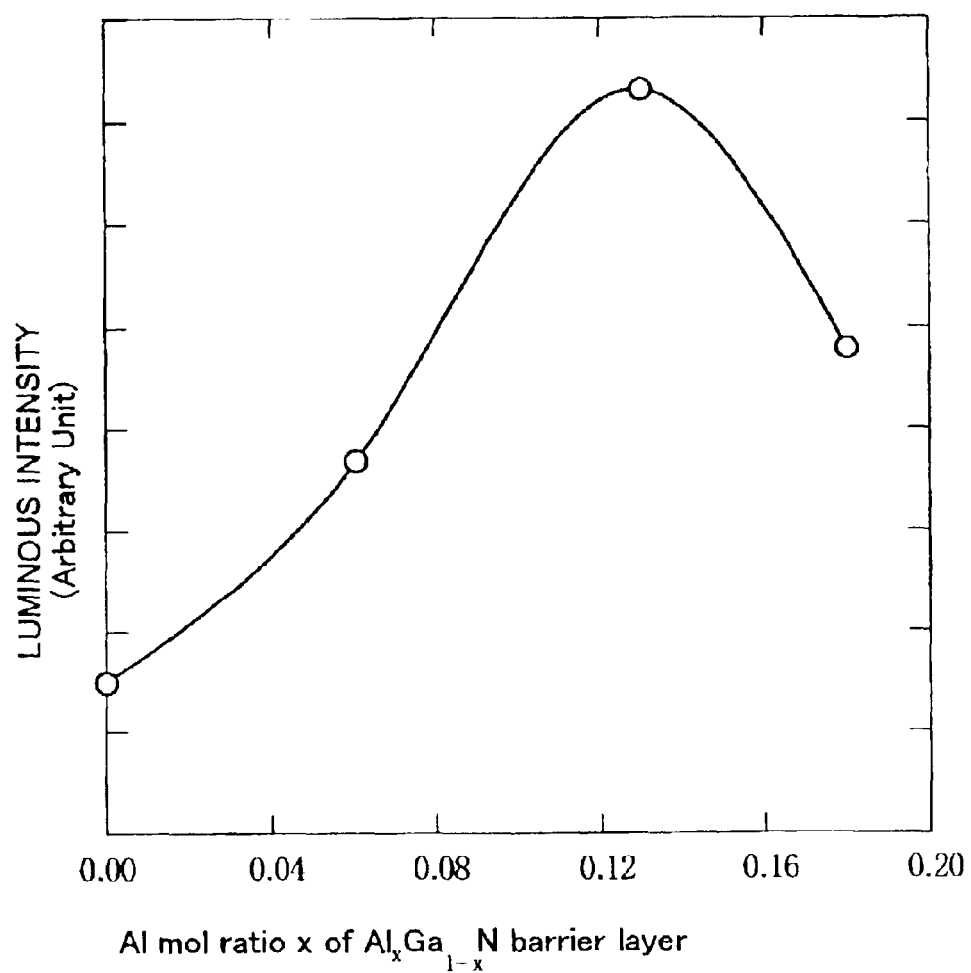
FIG. 2 is a graph showing the correlation of a composition ratio x of aluminum (Al) and a luminous intensity in the barrier layer 151 made of $Al_xGa_{1-x}N$, in accordance with the first embodiment of the present invention.

Various samples of a barrier layer made of $Al_xGa_{1-x}N$, each having a different composition ratio x of aluminum (Al), were formed in the same process described above. FIG. 2 illustrates the electroluminescence (EL) luminous intensity of the light-emitting device 100 having the barrier layer made of $Al_xGa_{1-x}N$. As shown in FIG. 2, the luminous intensity of the light-emitting device 100 becomes larger in accordance with the composition ratio of aluminum (Al). The composition ratio x should be preferably in the range of $0.06 \leq x \leq 0.18$, more preferably $0.1 \leq x \leq 0.14$.

Figure 3:
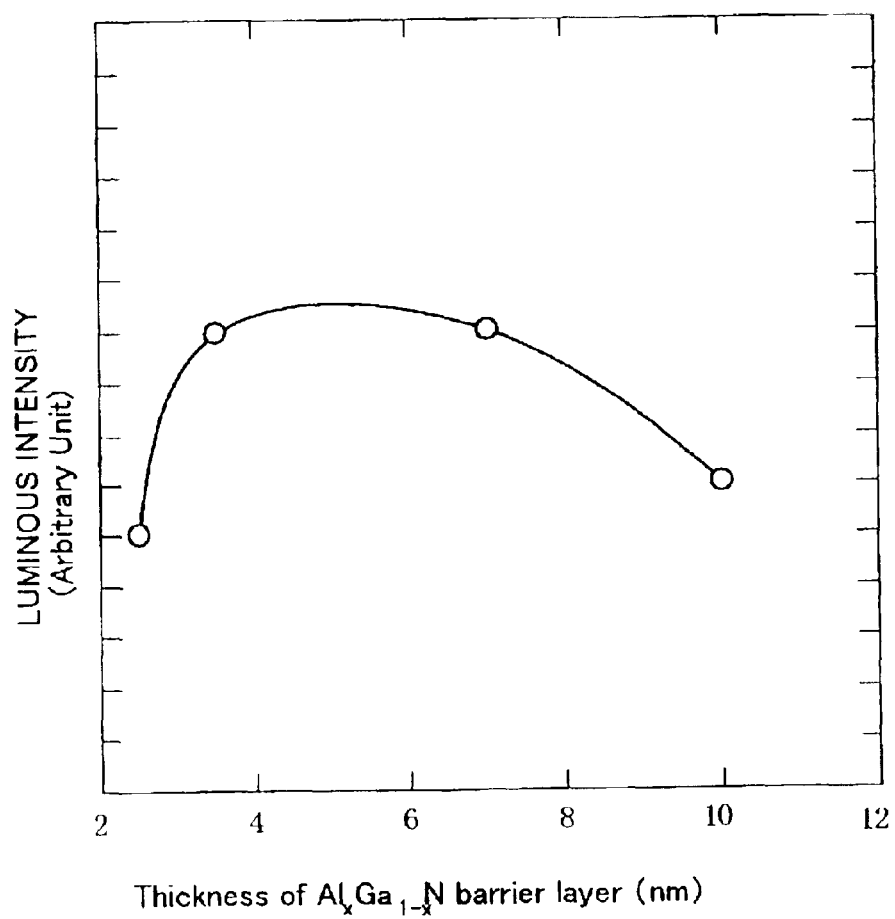
FIG. 3 is a graph showing the correlation of a thickness and a luminous intensity of the barrier layer 151 made of $Al_xGa_{1-x}N$, in accordance with the first embodiment of the present invention.

Various samples of a barrier layer each having a different thickness were formed. FIG. 3 illustrates the electroluminescence (EL) luminous intensity of the light-emitting device 100 having the barrier layer made of $Al_xGa_{1-x}N$. As shown in FIG. 3, the thickness of the barrier layer should be preferably in the range of 2 nm to 10 nm, more preferably 3 nm to 8 nm.

In the first embodiment, the light-emitting device 100 having the strain relaxation layer 114 is shown. Alternatively, the layer should not be limited to a strain relaxation layer. Alternatively, an n-cladding layer can be formed in place of the strain relaxation layer 114.

Alternatively, the well layer, the p-cladding layer, the n-contact layer and the p-contact layer, or all the layers formed in the light-emitting device 100 except the barrier layer, can be made of quaternary, ternary, or binary nitride compound semiconductor which satisfies the formula $Al_xGa_{1-x-y}In_yN$, ($0 \leq x \leq 1$, $0 \leq y \leq 1$), having an arbitrary composition ratio. Also, the strain relaxation layer can be made of $In_xGa_{1-x}N$ (0<x<1), having an arbitrary composition ratio.

The luminous efficiency of the light-emitting device 100 may become smaller without a strain relaxation layer, but it can be larger than that of the conventional light-emitting device.

In the first embodiment, magnesium (Mg) was used as a p-type impurity. Alternatively, Group II elements such as beryllium (Be), zinc (Zn), etc. can be used.

The device in the present invention can be applied not only to a light-emitting device but also a light-receiving device.

(Second Embodiment)

Figure 4:
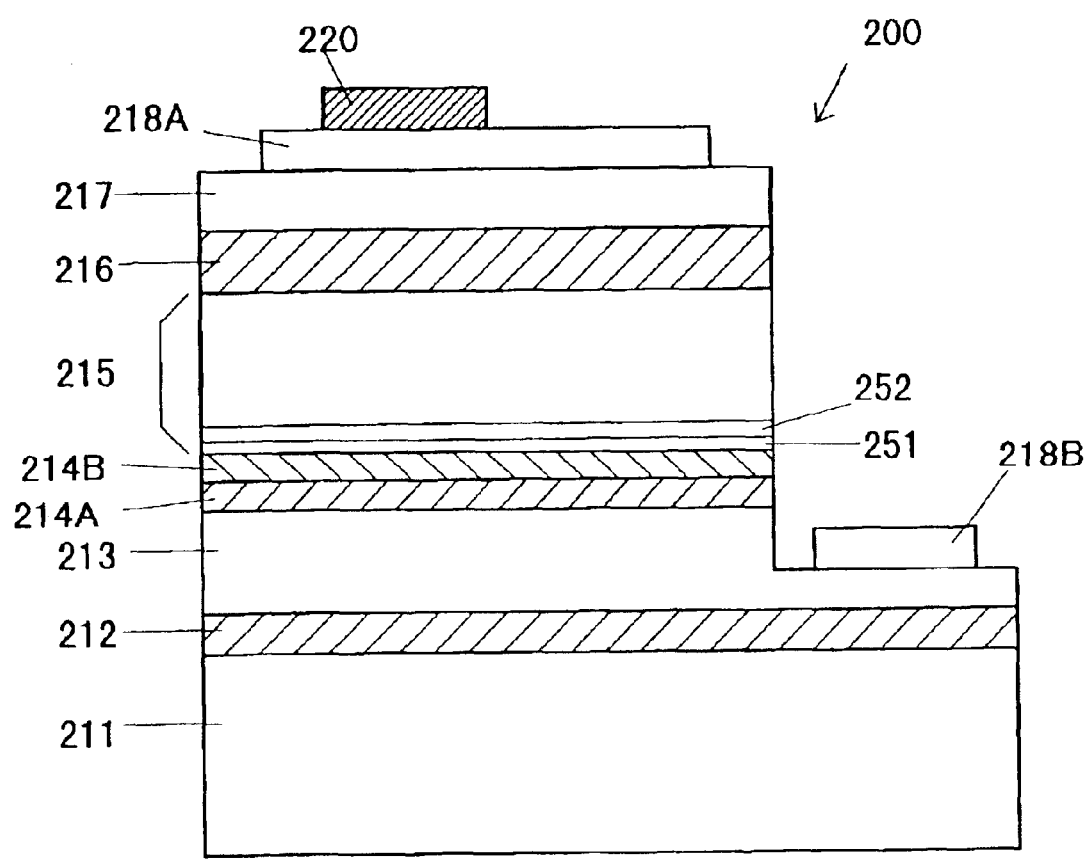
FIG. 4 is a sectional view of a light-emitting device 200 using gallium nitride compound in accordance with the second embodiment of the present invention.

FIG. 4 illustrates a sectional view of a light-emitting device 200 using gallium nitride (GaN) compound semiconductor formed on a sapphire substrate 211. The light-emitting device 200 has a sapphire substrate 211 which has a buffer layer 212 made of nitride aluminum (AlN) having a thickness of 25 nm and an n-contact layer 213 made of silicon (Si) doped GaN and having a thickness of 3 $\mu$m successively thereon.

And a strain relaxation layer 214A made of a non-doped $In_{0.03}Ga_{0.97}N$ having a thickness of about 180 nm is formed on the n-contact layer 213. The strain relaxation layer 214A functions to relax a stress to an emission layer 215, generated by the difference between thermal expansion coefficients of the sapphire substrate 211 and the emission layer 215. And an n-cladding layer 214B made of a silicon (Si) doped $Al_{0.05}Ga_{0.95}N$ having a thickness of about 200 nm is formed on the strain relaxation layer 214A.

An emission layer 215 is constructed with a multi quantum-well (MQW) structure, which is made of six barrier layers 251 made of $Al_{0.13}Ga_{0.87}N$ having a thickness of about 3.5 nm and five well layers 252 made of $In_{0.05}Ga_{0.95}N$ having a thickness of about 3 nm laminated alternately, is formed on the n-cladding layer 214B. A p-cladding layer 216 made of a p-type $Al_{0.15}Ga_{0.85}N$ having a thickness of about 25 nm is formed on the emission layer 215. Further, a p-contact layer 217 made of a p-type GaN having a thickness about 100 nm is formed on the p-cladding layer 216.

An electrode 218A which transmits lights is formed by a metal deposit on the p-contact layer 217 and an electrode 218B is formed on the n-contact layer 213. The electrode 218A which transmits lights is constructed with about 1.5 nm in thickness of cobalt (Co), which contacts to the p-contact layer 217, and about 6 nm in thickness of gold (Au), which contacts to the cobalt (Co). The electrode 218B is constructed with about 20 nm in thickness of vanadium (V) and about 1800 nm in thickness of aluminum (Al) or an alloy including aluminum (Al). And an electrode pad 220 having a thickness about 1500 nm is formed on the electrode 218A. The electrode pad 220 is made of cobalt (Co), nickel (Ni) or vanadium (V), and gold (Au) or aluminum (Al), or an alloy including at least one of these metals.

Then a method for manufacturing the light-emitting device 200 is explained hereinafter.

Each of the layers of the light-emitting device 200 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 211 was placed on a susceptor in a reaction chamber for the MOVPE treatment after its main surface 'a' was cleaned by an organic washing solvent and heat treatment. Then the sapphire substrate 211 was baked at 1100° C. by $H_2$ vapor fed into the chamber under normal pressure.

About 25 nm in thickness of AlN buffer layer 212 was formed on the surface 'a' of the baked sapphire substrate 211 under conditions controlled by lowering the temperature in the chamber to 400° C., keeping the temperature constant, and concurrently supplying $H_2$, $NH_3$ and TMA.

About 3 µm in thickness of GaN was formed on the buffer layer 212, as an n-contact layer 213 with an electron concentration of $2 \times 10^{18}/cm^3$, under conditions controlled by keeping the temperature of the sapphire substrate 211 at 1150° C. and concurrently supplying $H_2$, $NH_3$, TMG and silane.

About 180 nm in thickness of non-doped $In_{0.03}Ga_{0.97}N$ was formed on the n-contact layer 213, as a strain relaxation layer 214A, under conditions controlled by lowering the temperature of the sapphire substrate 211 to 850° C., keeping the temperature constant and concurrently supplying $N_2$ or $H_2$, $NH_3$, TMG and TMI.

After forming the strain relaxation layer 214A, about 200 nm in thickness of $Al_{0.05}Ga_{0.95}N$ was formed on the strain relaxation layer 214A, as an n-cladding layer 214B with an electron concentration of $2 \times 10^{17}/cm^3$, under conditions controlled by raising the temperature of the sapphire substrate 211 to 1150° C., keeping the temperature constant and concurrently supplying $N_2$ or $H_2$, $NH_3$, TMG, TMA and silane.

About 3.5 nm in thickness of $Al_{0.13}Ga_{0.87}N$ was formed on the n-cladding layer 214B, as a barrier layer 251, concurrently supplying $N_2$ or $H_2$, $NH_3$, TMG and TMA. And about 3 nm in thickness of $In_{0.05}Ga_{0.95}N$ was formed on the barrier layer 215, as a well layer 252, concurrently supplying $N_2$ or $H_2$, $NH_3$, TMG and TMI. Similarly, four pairs of the barrier layer 251 and the well layer 252 were formed in sequence under the same respective conditions, and then a barrier layer 251 made of $Al_{0.13}Ga_{0.87}N$ was formed on the fifth pair of the barrier layer 251 and the well layer 252. Accordingly, an emission layer 215 having a multi-quantum well (MQW) structure was formed.

About 25 nm in thickness of Mg-doped p-type $Al_{0.15}Ga_{0.85}N$ was formed on the emission layer 215, as a p-cladding layer 216, under conditions controlled by keeping the temperature of the sapphire substrate 111 at 1150° C. and concurrently supplying $N_2$ or $H_2$, $NH_3$, TMG, TMA and $CP_2Mg$.

About 100 nm in thickness of Mg-doped p-type GaN was formed on the p-cladding layer 216, as a p-contact layer 217, under conditions controlled by keeping the temperature of the sapphire substrate 211 at 1100° C. and concurrently supplying $N_2$ or $H_2$, $NH_3$, TMG, and $CP_2Mg$.

An etching mask is formed on the p-contact layer 217, and a predetermined region of the mask is removed. Then, exposed portions of the p-contact layer 217, the p-cladding layer 216, the emission layer 215, the strain relaxation layer 214A, and some part of the n-contact layer 213 were etched by a reactive ion etching using gas including chlorine (Cl). Accordingly, the surface of the n-contact layer 213 was exposed.

Then, an electrode 218B and an electrode 218A which transmits lights were formed on the n-contact layer 213 and the p-contact layer 217, respectively, as follows.

(1) A photoresist layer was laminated on the n-contact layer 213. A window was formed on a fixed region of the exposed surface of the n-contact layer 213 by patterning using photolithography. After exhausting in high vacuum lower than $10^{-4}$ Pa vacuum order, about 20 nm in thickness of vanadium (V) and about 1800 nm in thickness of aluminum (Al) were deposited on the window. Then, the photoresist layer laminated on the n-contact layer 213 was removed. Accordingly, the electrode 218B was formed on the exposed surface of the n-contact layer 213.

(2) A photoresist layer was laminated on the p-contact layer 217. The photoresist layer of an electrode forming part on the p-contact layer 217 was removed by patterning using photolithography, and a window was formed there.

(3) After exhausting in high vacuum lower than $10^{-6}$ Torr vacuum order, about 1.5 nm in thickness of cobalt (Co) and about 6 nm in thickness of gold (Au) were formed in sequence on the photoresist layer and the exposed surface of the p-contact layer 217 in a reaction chamber for deposit.

(4) The sample was took out from the reaction chamber for deposit. Then cobalt (Co) and gold (Au) laminated on the photoresist layer were removed by a lift-off, and an electrode 218A which transmits lights is formed on the p-contact layer 217.

(5) To form an electrode pad 220 for a bonding, a window was formed on a photoresist layer, which was laminated uniformly on the electrode 218A. About 1500 nm in thickness of cobalt (Co), nickel (Ni) or vanadium (V) and gold (Au), aluminum (Al) or an alloy including at least one of those metals were deposited on the photoresist layer. Then, as in the process (4), cobalt (Co), nickel (Ni) or vanadium (V) and gold (Au), aluminum (Al) or an alloy including at least one of those metals laminated on the photoresist layer were removed by a lift-off, and an electrode pad 220 was formed.

(6) After the atmosphere of the sample was exhausted by a vacuum pump, $O_2$ gas was supplied until the pressure becomes 3 Pa. Under conditions controlled by keeping the pressure constant and keeping the temperature of the atmosphere about 550° C., the sample was heated for about 3 min. Accordingly, the p-contact layer 217 and the p-cladding layer 216 were changed to have lower resistive p-type, and the p-contact layer 217 and the electrode 218A, and the n-contact layer 213 and the electrode 218B, respectively, are alloyed.

Through the process of (1) to (6), the light-emitting device 200 was formed.

Figure 5:
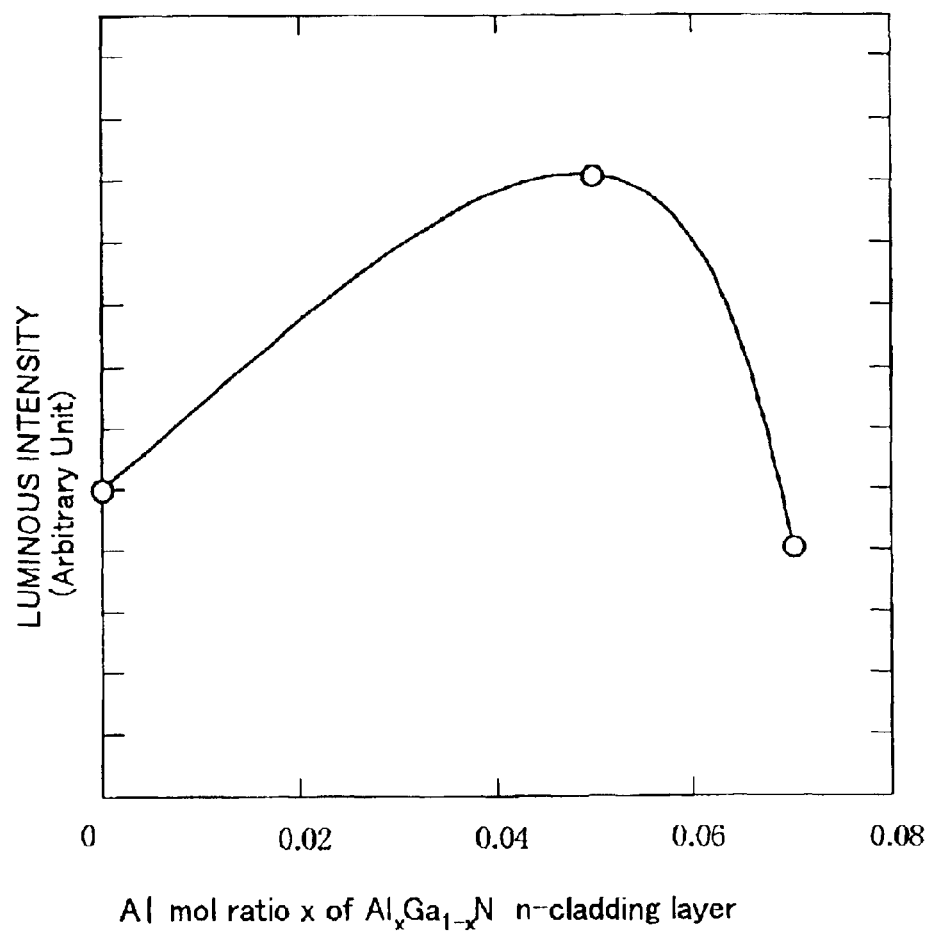
FIG. 5 is a graph showing the correlation of a composition ratio x of aluminum (Al) and a luminous intensity in the n-cladding layer 214B made of $Al_xGa_{1-x}N$, in accordance with the second embodiment of the present invention.

Various samples of an n-cladding layer made of $Al_xGa_{1-x}N$, each having a different composition ratio x of aluminum (Al), were formed in the same process described above. FIG. 5 illustrates the electroluminescence (EL) luminous intensity of the light-emitting device 200 having the n-cladding layer made of $Al_xGa_{1-x}N$. As shown in FIG. 5, the luminous intensity of the light-emitting device 200 becomes larger in accordance with the composition ratio of aluminum (Al). The composition ratio x should be preferably in the range of $0.03 \leq x \leq 0.06$, more preferably $0.04 \leq x \leq 0.055$.

Figure 6:
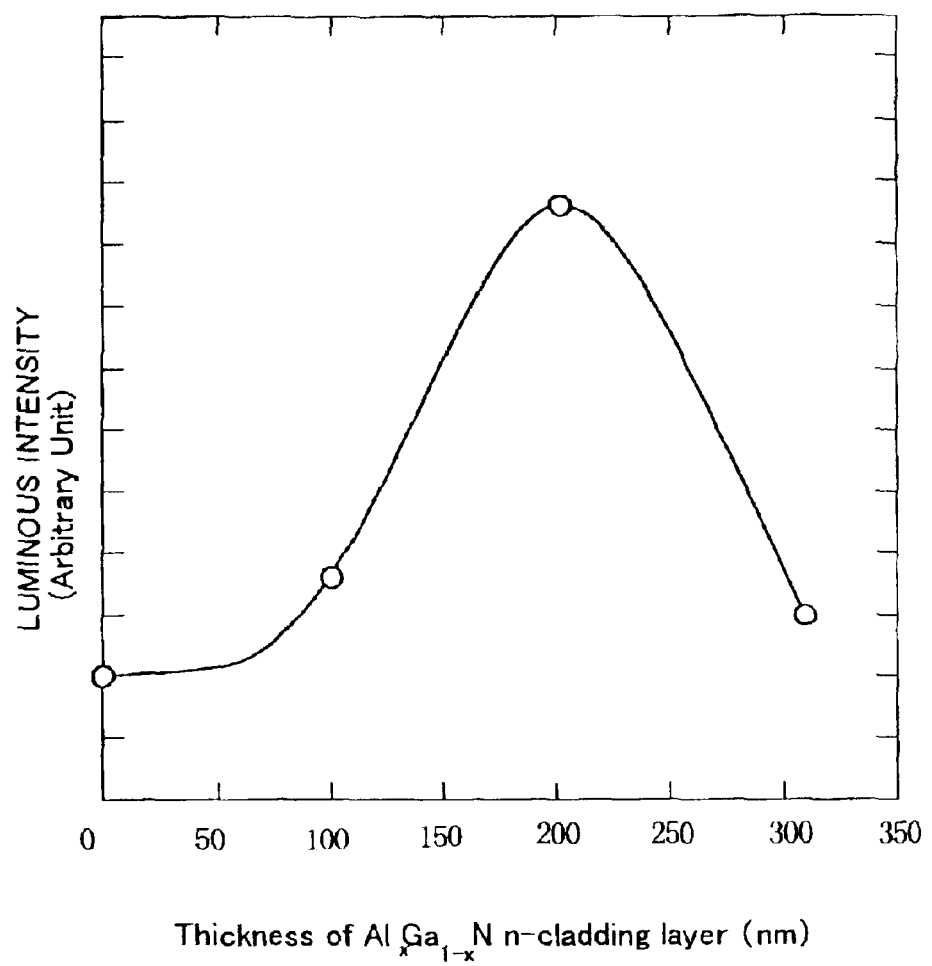
FIG. 6 is a graph showing the correlation of a thickness and a luminous intensity of the n-cladding layer 214B made of $Al_xGa_{1-x}N$, in accordance with the second embodiment of the present invention.

Various samples of an n-cladding layer each having a different thickness were formed. FIG. 6 illustrates the electroluminescence (EL) luminous intensity of the light-emitting device 100 having the n-cladding layer made of $Al_xGa_{1-x}N$. As shown in FIG. 6, the thickness of the barrier layer should be preferably in the range of 50 nm to 300 nm, more preferably 150 nm to 250 nm.

In the second embodiment, the light-emitting device 200 has the emission layer 215 with multi quantum-well (MQW) structure. Alternatively, the emission layer 215 can have a single quantum-well structure.

Alternatively, the barrier layer, the well-layer, the p-cladding layer, the n-contact layer and the p-contact layer, or all the layers formed in the light-emitting device 200 except the n-cladding layer and the strain relaxation layer, can be made of quaternary, ternary, or binary nitride compound semiconductor which satisfies the formula $Al_xGa_{1-x-y}In_yN$, ($0 \leq x \leq 1$, $0 \leq y \leq 1$), having an arbitrary composition ratio. Also, the strain relaxation layer can be made of $In_xGa_{1-x}N$ ($0<x<1$), having an arbitrary composition ratio.

The luminous efficiency of the light-emitting device 200 may become smaller without a strain relaxation layer, but it can be larger than that of the conventional light-emitting device.

In the second embodiment, magnesium (Mg) was used as a p-type impurity. Alternatively, Group II elements such as beryllium (Be), zinc (Zn), etc. can be used.

The device in the present invention can be applied not only to a light-emitting device but also a light-receiving device.

(Third Embodiment)

Figure 7:
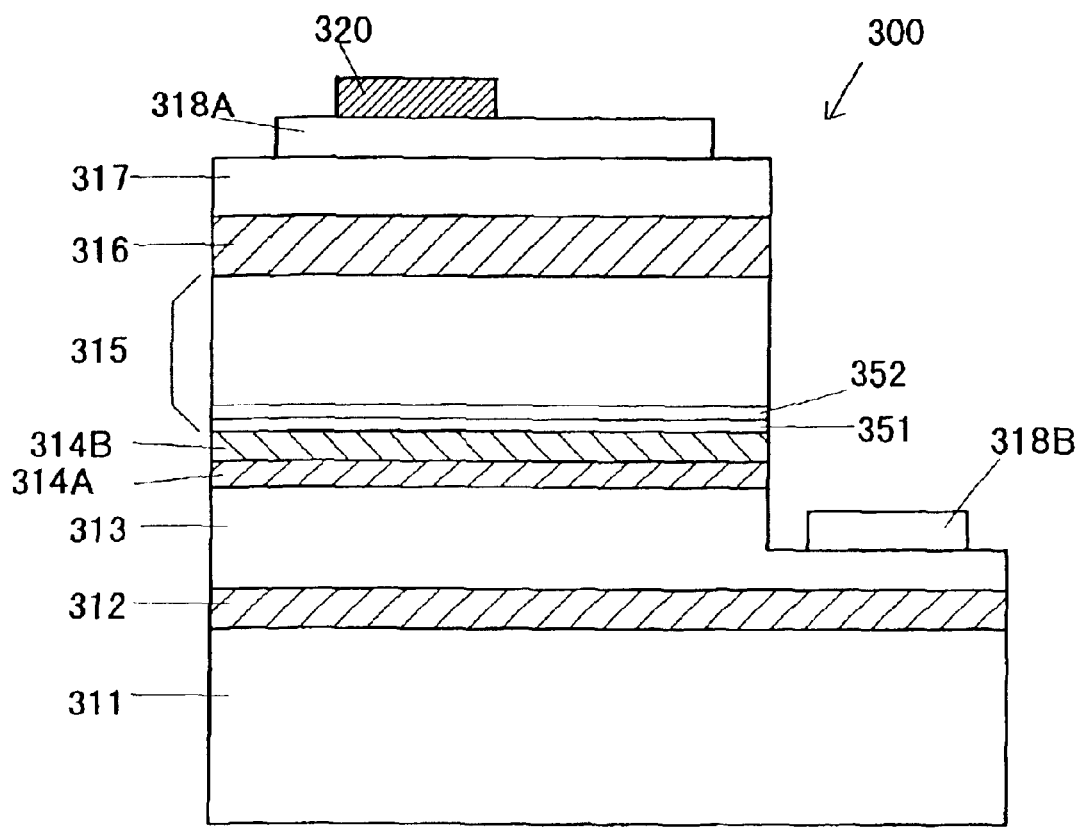
FIG. 7 is a sectional view of a light-emitting device 300 using gallium nitride compound in accordance with the third embodiment of the present invention.

FIG. 7 illustrates a sectional view of a light-emitting device 300 using gallium nitride (GaN) compound semiconductor formed on a sapphire substrate 311. The light-emitting device 300 has a sapphire substrate 311 which has a buffer layer 312 made of nitride aluminum (AlN) having a thickness of 25 nm and an n-contact layer 313 made of silicon (Si) doped GaN and having a thickness of 3 $\mu$m successively thereon.

And a strain relaxation layer 314A made of a non-doped $In_{0.03}Ga_{0.97}N$ having a thickness of about 180 nm is formed on the n-contact layer 313. The strain relaxation layer 314A functions to relax a stress to an emission layer 315, generated by the difference between thermal expansion coefficients of the sapphire substrate 311 and the emission layer 315. And an n-cladding layer 314B made of a silicon (Si) doped $Al_{0.05}Ga_{0.95}N$ having a thickness of about 200 nm is formed on the strain relaxation layer 314A.

An emission layer 315 is constructed with a multi quantum-well (MQW) structure, which is made of six barrier layers 351 made of $Al_{0.13}Ga_{0.87}N$ having a thickness of about 3.5 nm and five well layers 352 made of $In_{0.05}Ga_{0.95}N$ having a thickness of about 3 nm laminated alternately, is formed on the n-cladding layer 314B. A p-cladding layer 316 made of a p-type $Al_{0.15}Ga_{0.85}N$ having a thickness of about 25 nm is formed on the emission layer 315. Further, a p-contact layer 317 made of a p-type GaN having a thickness about 100 nm is formed on the p-cladding layer 316.

An electrode 318A which transmits lights is formed by a metal deposit on the p-contact layer 317 and an electrode 318B is formed on the n-contact layer 313. The electrode 318A which transmits lights is constructed with about 1.5 nm in thickness of cobalt (Co), which contacts to the p-contact layer 317, and about 6 nm in thickness of gold (Au), which contacts to the cobalt (Co). The electrode 318B is constructed with about 20 nm in thickness of vanadium (V) and about 1800 nm in thickness of aluminum (Al) or an alloy including aluminum (Al). And an electrode pad 320 having a thickness about 1500 nm is formed on the electrode 318A. The electrode pad 320 is made of cobalt (Co), nickel (Ni) or vanadium (V), and gold (Au) or aluminum (Al), or an alloy including these metals.

Then a method for manufacturing the light-emitting device 300 is explained hereinafter.

Each of the layers of the light-emitting device 300 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 311 was placed on a susceptor in a reaction chamber for the MOVPE treatment after its main surface 'a' was cleaned by an organic washing solvent and heat treatment. Then the sapphire substrate 311 was baked at 1100° C. by $H_2$ vapor fed into the chamber under normal pressure.

About 25 nm in thickness of AlN buffer layer 312 was formed on the surface 'a' of the baked sapphire substrate 311 under conditions controlled by lowering the temperature in the chamber to 400° C., keeping the temperature constant, and concurrently supplying $H_2$, $NH_3$ and TMA.

About 3 $\mu$m in thickness of n-type GaN was formed on the buffer layer 312, as an n-contact layer 313, under conditions controlled by keeping the temperature of the sapphire substrate 311 at 1150° C. and concurrently supplying $H_2$, $NH_3$, TMG and silane.

About 180 nm in thickness of non-doped $In_{0.03}Ga_{0.97}N$ was formed on the n-contact layer 313, as a strain relaxation layer 314A, under conditions controlled by lowering the temperature of the sapphire substrate 311 to 850° C., keeping the temperature constant and concurrently supplying $N_2$ or $H_2$, $NH_3$, TMG and TMI.

After forming the strain relaxation layer 314A, about 200 nm in thickness of n-type $Al_{0.05}Ga_{0.95}N$ was formed on the strain relaxation layer 314A, as an n-cladding layer 314B, under conditions controlled by raising the temperature of the sapphire substrate 311 to 1150° C., keeping the temperature constant and concurrently supplying $N_2$ or $H_2$, $NH_3$, TMG, TMA and silane.

About 3.5 nm in thickness of $Al_{0.13}Ga_{0.87}N$ was formed on the n-cladding layer 314B, as a barrier layer 351, concurrently supplying $N_2$ or $H_2$, $NH_3$, TMG and TMA. And about 3 nm in thickness of $In_{0.05}Ga_{0.95}N$ was formed on the barrier layer 315, as a well layer 352, concurrently supplying $N_2$ or $H_2$, $NH_3$, TMG and TMI. Similarly, four pairs of the barrier layer 351 and the well layer 352 were formed in sequence under the respective same conditions, and then a barrier layer 351 made of $Al_{0.13}Ga_{0.87}N$ was formed on the fifth pair of the barrier layer 351 and the well layer 352. Accordingly, an emission layer 315 having a multi-quantum well (MQW) structure was formed.

About 25 nm in thickness of Mg-doped p-type $Al_{0.15}Ga_{0.85}N$ was formed on the emission layer 315, as a p-cladding layer 316, under conditions controlled by keeping the temperature of the sapphire substrate 311 at 1150° C. and concurrently supplying $N_2$ or $H_2$, $NH_3$, TMG, TMA and $CP_2Mg$.

About 100 nm in thickness of Mg-doped p-type GaN was formed on the p-cladding layer 316, as a p-contact layer 317, under conditions controlled by keeping the temperature of the sapphire substrate 311 at 1100° C. and concurrently supplying $N_2$ or $H_2$, $NH_3$, TMG, and $CP_2Mg$.

An etching mask is formed on the p-contact layer 317, and a predetermined region of the mask is removed. Then, exposed portions of the p-contact layer 317, the p-cladding layer 316, the emission layer 315, the strain relaxation layer 314A, and some part of the n-contact layer 313 were etched by a reactive ion etching using gas including chlorine (Cl). Accordingly, the surface of the n-contact layer 313 was exposed.

Then, an electrode 318B and an electrode 318A which transmits lights were formed on the n-contact layer 313 and the p-contact layer 317, respectively, as follows.

(1) A photoresist layer was laminated on the n-contact layer 313. A window was formed on a fixed region of the exposed surface of the n-contact layer 313 by patterning using photolithography. After exhausting in high vacuum lower than $10^{-4}$ Pa vacuum order, about 20 nm in thickness of vanadium (V) and about 1800 nm in thickness of aluminum (Al) were deposited on the window. Then, the photoresist layer laminated on the n-contact layer 313 was removed. Accordingly, the electrode 218B was formed on the exposed surface of the n-contact layer 313.

(2) A photoresist layer was laminated on the p-contact layer 317. The photoresist layer of an electrode forming part on the p-contact layer 317 was removed by patterning using photolithography, and a window was formed there.

(3) After exhausting in high vacuum lower than $10^{-4}$ Pa vacuum order, about 1.5 nm in thickness of cobalt (Co) and about 6 nm in thickness of gold (Au) were formed in sequence on the photoresist layer or the exposed surface of the p-contact layer 317 in a reaction chamber for deposit.

(4) The sample was took out from the reaction chamber for deposit. Then cobalt (Co) and gold (Au) laminated on the photoresist layer were removed by a lift-off, and an electrode 318A which transmits lights is formed on the p-contact layer 317.

(5) To form an electrode pad 320 for a bonding, a window was formed on a photoresist layer, which was laminated uniformly on the electrode 318A. About 1500 nm in thickness of cobalt (Co), nickel (Ni) or vanadium (V) and gold (Au), aluminum (Al) or an alloy including at least one of those metals were deposited on the photoresist layer. Then, as in the process (4), cobalt (Co), nickel (Ni) or vanadium (V) and gold (Au), aluminum (Al) or an alloy including at least one of those metals laminated on the photoresist layer were removed by a lift-off, and an electrode pad 320 was formed.

(6) After the atmosphere of the sample was exhausted by a vacuum pump, $O_2$ gas was supplied until the pressure becomes 3 Pa. Under conditions controlled by keeping the pressure constant and keeping the temperature of the atmosphere about 550° C., the sample was heated for about 3 min. Accordingly, the p-contact layer 317 and the p-cladding layer 316 were changed to have lower resistive p-type, and the p-contact layer 317 and the electrode 318A, and the n-contact layer 313 and the electrode 318B, respectively, are alloyed.

Through the process of (1) to (6), the light-emitting device 300 was formed.

Figure 8:
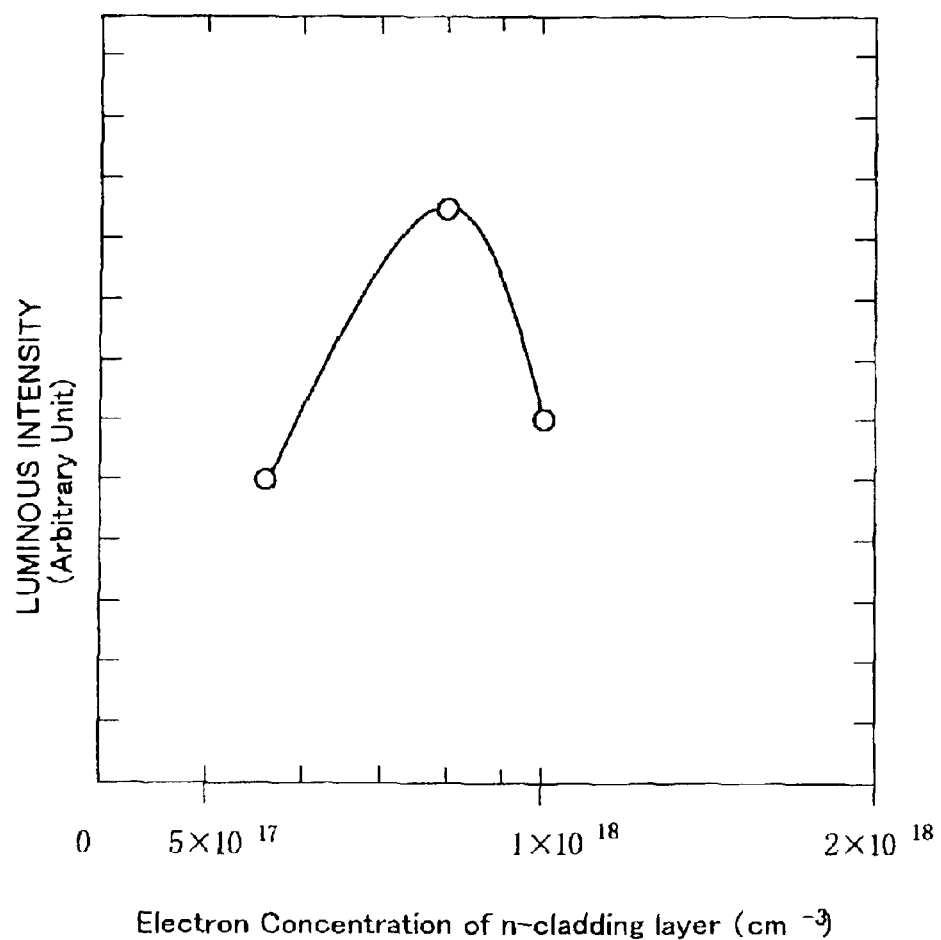
FIG. 8 is a graph showing the correlation of an electron concentration and a luminous intensity of the n-cladding layer in accordance with the third embodiment of the present invention.

Various samples of an n-cladding layer 314B made of n-type $Al_{0.05}Ga_{0.95}N$, each having a different electron concentration, were formed in the same process described above. FIG. 8 illustrates the electroluminescence (EL) luminous intensity of the light-emitting device 300 having the n-cladding layer. As shown in FIG. 8, the luminous intensity of the light-emitting device 300 becomes larger around $8\times10^{17}/cm^3$.

Figure 9:
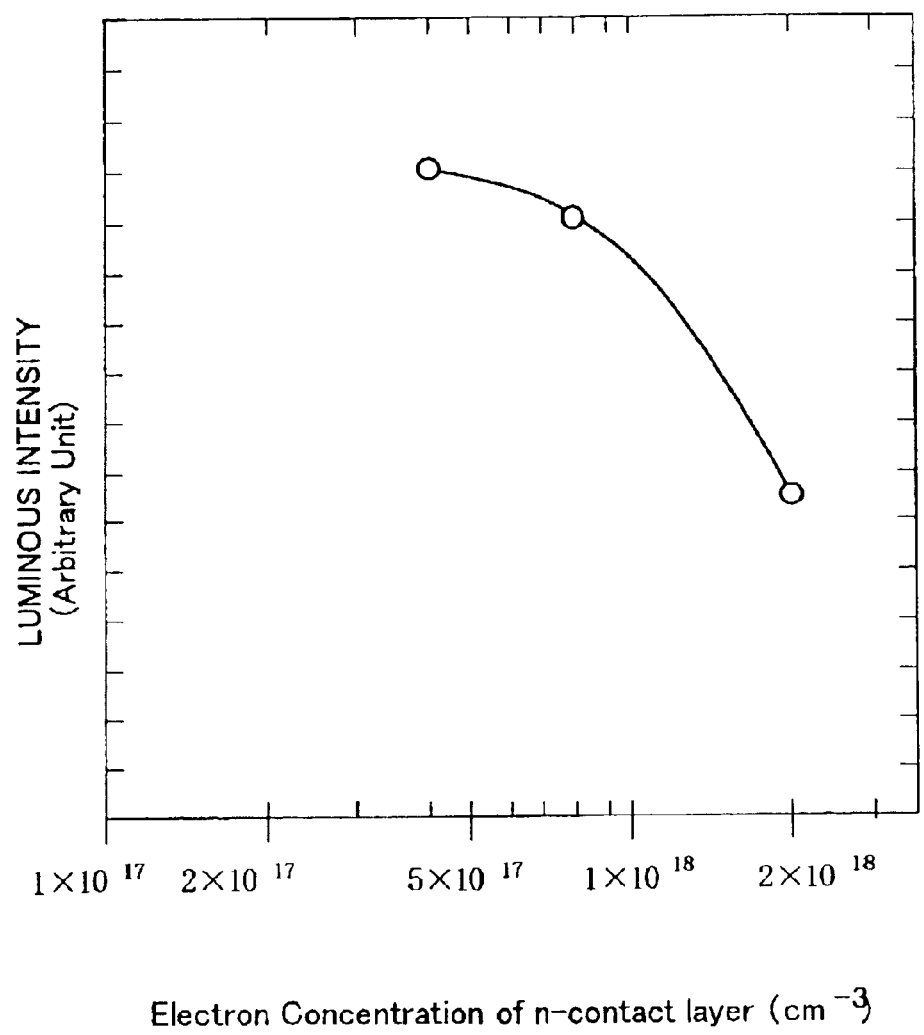
FIG. 9 is a graph showing the correlation of an electron concentration and a luminous intensity of the n-contact layer in accordance with the third embodiment of the present invention.

Various samples of an n-contact layer 313 made of n-GaN, each having a different electron concentration, were formed in the same process described above. FIG. 9 illustrates the electroluminescence (EL) luminous intensity of the light-emitting device 300 having the n-contact layer. As shown in FIG. 9, the luminous intensity of the light-emitting device 300 becomes larger in accordance that the electron concentration of the n-contact layer becomes $1.1\times10^{18}/cm^3$, $8\times10^{17}/cm^3$, and $4\times10^{17}/cm^3$.

Because the hole concentration of each p-layers (the p-cladding layer and the p-contact layer) is $7\times10^{17}/cm^3$, the luminous efficiency become larger when a ratio of the electron concentration of n-layer to the hole concentration of the p-layer is in the range of 0.5 to 2.0. In short, the value of dividing the electron concentration by the hole concentration is in the range of 0.5 to 2.0. Preferably, the ratio of the hole concentration of the p-layer and the electron concentration of n-layer should be in the range from 0.7 to 1.43, more preferably, from 0.8 to 1.25.

In the third embodiment, the light-emitting device 300 has the emission layer 315 with multi quantum-well (MQW) structure. Alternatively, the emission layer 315 can have a single quantum-well structure.

In condition that the ratio of the electron concentration of the n-layer to the hole concentration of the p-layer is as in the above embodiment, the barrier layer, the well-layer, the n-cladding or the p-cladding layer, and the n-contact or the p-contact layer can be made of quaternary, ternary, or binary nitride compound semiconductor which satisfies the formula $Al_xGa_{1-x-y}In_yN$, $(0 \leq x \leq 1, 0 \leq y \leq 1)$, having an arbitrary composition ratio.

The luminous efficiency of the light-emitting device 300 may become smaller without an n-cladding layer or a strain relaxation layer, but it can be larger than that of the conventional light-emitting device.

In the third embodiment, magnesium (Mg) was used as a p-type impurity. Alternatively, Group II elements such as beryllium (Be), zinc (Zn), etc. can be used.

The device in the present invention can be applied not only to a light-emitting device but also a light-receiving device.

(Other Embodiment)

The following methods can be applied to the above embodiments.

(1) A method for forming a buffer layer

In the above embodiments, a buffer layer is formed at a low temperature of 400° C. to 600° C. Alternatively, a buffer layer can be formed at a temperature of 1000° C. to 1180° C. by MOCVD. Preferably, the temperature should be in the range of 1050° C. to 1170° C., and more preferably, 1100° C. to 1150° C. A buffer layer made of AlN having a thickness of 2.3 μm is formed on a sapphire substrate, at a growth temperature of 1050° C., 1110° C., 1130° C., 1150° C., 1170° C., and 1200° C. A GaN layer having a thickness of 2 μm is formed on the buffer layer at the same growth temperature, and a surface mophology of the GaN layer is observed by an optical microscope. The surface mophology of the GaN layer is best when the growth temperature of the buffer layer is 1130° C. The surface mophology of the GaN layer better when the growth temperature of the buffer layer is 1110° C. and 1150° C., less better 1050° C., 1170° C.

When the growth temperature of the buffer layer is 1200° C., the surface mophology of the GaN is not good. Accordingly, the growth temperature of the buffer layer is preferably in the range of 1000° C. to 1180° C. as described above.

In the above embodiment, a buffer layer is made of AlN. Alternatively, a buffer layer can be made of GaN, InN, $Al_xGa_{1-x}N$ (0<x<1), $In_xGa_{1-x}N$ (0≦x<1), $Al_xIn_{1-x}N$ (0<x<1), and $Al_xGa_yIn_{1-x-y}N$ (0≦x<1, 0<y<1, 0≦x+y<1). Alternatively, a buffer layer can be also made of $Al_xGa_yIn_{1-x-y}N$ (0≦x≦1, 0≦y≦1, 0<x+y<1) in which a part of the group III element is changed to boron (B) or thallium (Tl), and a part of nitrogen (N) is changed to phosphorus (P), arsenic (As), antimony (Sb), bismuth (Bi), and so on. Further alternatively, a buffer layer can be doped with an n-type dopant such as silicon (Si), or a p-type dopant such as magnesium (Mg).

(2) After forming a nitride film having a thickness of 10 to 300 Å on the sapphire substrate, a buffer layer made of AlN is formed. A thickness of the buffer layer should be preferably in the range of 1.2 μm to 3.2 μm, and more preferably 1.5 μm to 3.3 μm. A growth rate of the buffer layer should be preferably in the range of 10 nm/min. to 250 nm/min. AlN layers, each having a thickness of 0.8 μm, 1.0 μm, 1.5 μm, 2.3 μm, 3.0 μm, and 3.3 μm, was formed on the sapphire substrate at 1130° C., at which temperature a surface mophology of a AlN layer is the best. A GaN layer having a thickness of 2 μm was formed at 1130° C. on the buffer layer in each of the samples, and a surface mophology of the GaN layer is observed.

When the thickness of the AlN layer is 2.3 μm, a perfect specular reflection can be obtained. When the thickness is 1.5 μm and 3.3 μm, an approximate specular reflection can be obtained. But when the thickness is 0.8 μm, 1.0 μm, and 3.0 μm, a specular reflection cannot be obtained, and a crystal growth is difficult on the GaN layer. Accordingly, the thickness of the buffer layer should be preferably in the range described above.

And after forming a nitrogenated layer having a thickness of 0 to 10 Å on the sapphire substrate, buffer layers made of AlN, each having a thickness of 0.015 μm, 0.30 μm, 0.45 μm, 0.90 μm, 1.90 μm, and 2.30 μm, are formed at 1130° C. Then a GaN layer was formed on the buffer layer in each of the samples, and a surface mophology of the GaN layer is observed.

When the thickness of the AlN buffer layer is 0.30 μm and 0.45 μm, a perfect specular reflection can be obtained. When the thickness is 0.015 μm and 0.90 μm, an approximate specular reflection can be obtained. But when the thickness is 1.90 μm and 2.30 μm, a specular reflection cannot be obtained, and a crystal growth is difficult on the GaN layer. Accordingly, the thickness of the buffer layer should be preferably in the range of 0.01 μm to 2.3 μm. The thickness should be preferably in the range of 0.1 μm to 1.5 μm, more preferably 0.2 μm to 0.5 μm, the most preferably 0.3 μm to 0.45 μm.

(3) The sapphire substrate is desirably treated by a nitriding treatment before forming a buffer layer. The sapphire substrate is cleaned under conditions controlled by raising the temperature in the chamber to 1000° C., keeping the temperature constant, and concurrently supplying $H_2$. Using $H_2$ gas as a carrier, $NH_3$, hydrazine ($H_2NNH_2$), and/or organic amine are supplied to complete the nitriding treatment. The thickness of the nitride film on the sapphire substrate should be preferably in the range of 0 Å to 300 Å.

(4) In the other embodiment, a buffer layer is formed by MOCVD. Alternatively, MBE can be applied to form a buffer layer. Further alternatively, sputtering can be applied.

A buffer layer made of AlN can be formed by a reactive sputtering in a DC magnetron sputtering equipment, using a high purity metal aluminum (Al) and $N_2$ gas as source materials. Alternatively, a buffer layer made of $Al_xGa_yIn_{1-x-y}N$ (0≦x≦1, 0≦y≦1, 0≦x+y≦1, where composition ratios x and y are arbitrary figures) using a metal aluminum (Al), a metal gallium (Ga), a metal indium (In), $N_2$ or $NH_3$ gas can be formed as in a step (1) above. As a method for forming the buffer layer, evapolating, ion plating, laser abration, and ECR can be applied to sputtering. These physical vapor deposit should be preferably carried out at a temperature of 200° C. to 600° C., more preferably 300° C. to 500° C., and further more preferably 400° C. to 500° C.

When using these physical vapor deposition, the thickness of the buffer layer should be preferably in a range of 100 Å to 3000 Å. The thickness should be more preferably in a range of 100 Å to 2000 Å, and the most preferably 100 Å to 300 Å.

After the buffer layer is treated by a heat treatment in the atmosphere of $H_2$ and $NH_3$ gases for 5 minutes, a RHEED pattern was measured. As a result, a crystallization of the buffer layer treated by a heat treatment is improved compared with that of the buffer layer which is not treated by a heat treatment. A flow rate of $H_2$ gas and $NH_3$ gas used in the heat treatment should be preferably 1:0.1 to 1:1. The flow rate should be more preferably 1:0.1 to 1:0.5. A heating temperature should be preferably in a range of 1000° C. to 1250° C., more preferably 1050° C. to 1200° C., and the most preferably 1100° C. to 1150° C. Varying these heating condition or the flow rate of gases, a RHEED pattern of the buffer layer was measured. As a result, a crystallization of the buffer layer becomes better when a flow rate of gases and a heating temperature is in the range shown above. According to the result, a single crystallization is considered to be improved by a recrystallization of the buffer layer.

A GaN layer having a thickness of 4 μm was formed on the buffer layer by MOCVD, and then a rocking curve of the GaN layer was measured by an X-ray diffraction equipment. As a result, a single crystallization of GaN formed on the buffer layer, which is treated by the heat treatment as described above, becomes even or better compared with that of GaN formed on a buffer layer which is formed on a substrate by using MOCVD.

Because the buffer layer is formed by a physical vapor deposit and heat treated at a high temperature, a single crystallization of the buffer layer is promoted. As a result, the single crystallization of the GaN layer is considered to be improved.

(5) When a well layer and a barrier layer grow at a temperature of 830° C. to 930° C. and a difference between growth temperatures of the barrier and the well layers is Δ T≦50° C., a crystallization of an emission layer or an active layer is found to be improved. Here, the growth temperature of the barrier layer is higher than that of the well layer.

(6) A substrate can be made of sapphire, spinel ($MgAl_2O_2$), silicon (Si), carbon silicide (SiC), zinc oxide (ZnO), gallium phosphide (GaP), gallium arsenide (GaAs), magnesium oxide (MgO), manganese oxide, etc.

A buffer layer in all the above embodiments can be formed not only at a low growth temperature but a high growth temperature. Also, a buffer layer can be formed by sputtering.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-emitting device using gallium nitride compound semiconductor comprising:
    an emission layer with a multi quantum-well (MQW) structure, in which a barrier layer and a well layer are formed alternately; and
    an n-layer made of an impurity-doped $Al_xGa_{1-x}N$ ($0 \leq x \leq 0.06$),
    wherein a strain relaxation layer made of $In_yGa_{1-y}N$ ($0.02 \leq y \leq 0.04$) is formed between said n-layer and said emission layer.

2. A light-emitting device using gallium nitride compound semiconductor according to claim 1, wherein said n-layer has a thickness from 50 nm to 300 nm.

3. A light-emitting device using gallium nitride compound semiconductor according to claim 1, wherein said n-layer has a thickness from 150 nm to 250 nm.

4. A light-emitting device using gallium nitride compound semiconductor according to claim 1, wherein a luminous wavelength is in the ultraviolet rays range.

* * * * *